(12) United States Patent
Magoshi

(10) Patent No.: US 7,368,736 B2
(45) Date of Patent: May 6, 2008

(54) CHARGED BEAM EXPOSURE APPARATUS AND METHOD FOR MANUFACTURING MASK AND SEMICONDUCTOR DEVICE

(75) Inventor: Shunko Magoshi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 234 days.

(21) Appl. No.: 11/378,471

(22) Filed: Mar. 20, 2006

(65) Prior Publication Data

US 2006/0214116 A1    Sep. 28, 2006

(30) Foreign Application Priority Data

Mar. 22, 2005   (JP)   ............... 2005-082434

(51) Int. Cl.
*H01J 37/302* (2006.01)
(52) U.S. Cl. .............. 250/492.22; 250/492.23
(58) Field of Classification Search ........... 250/492.22, 250/492.23
See application file for complete search history.

(56) References Cited

U.S. PATENT DOCUMENTS 4,647,782 A * 3/1987 Wada et al. ............ 250/492.2
6,114,708 A * 9/2000 Kojima et al. ......... 250/492.23
7,002,167 B2 * 2/2006 Ogasawara ............ 250/492.22
7,122,809 B2 * 10/2006 Ogasawara ............ 250/492.22

FOREIGN PATENT DOCUMENTS

JP     3431445      5/2003

* cited by examiner

*Primary Examiner*—Kiet T Nguyen
(74) *Attorney, Agent, or Firm*—Finnegan, Henderson, Farabow, Garrett & Dunner, L.L.P.

(57) ABSTRACT

A exposure apparatus includes a charged beam radiating unit configured to radiate a charged beam, a shaping unit including an opening for shaping the beam, a storage unit to store a history of data concerning a beam area of the beam on the shaping unit, a predicting unit to predict change amount of dimensions of the beam passing through the opening to design dimensions of the opening, the predicting the change amount being carried out based on a relation between the beam area previously prepared and change amount of the dimensions of the beam passing through the opening to the design dimensions of the opening, and a correcting unit to correct dimension of a pattern which corresponds to the beam and is to be formed on the sample based on the change amount predicted by the predicting unit.

18 Claims, 10 Drawing Sheets

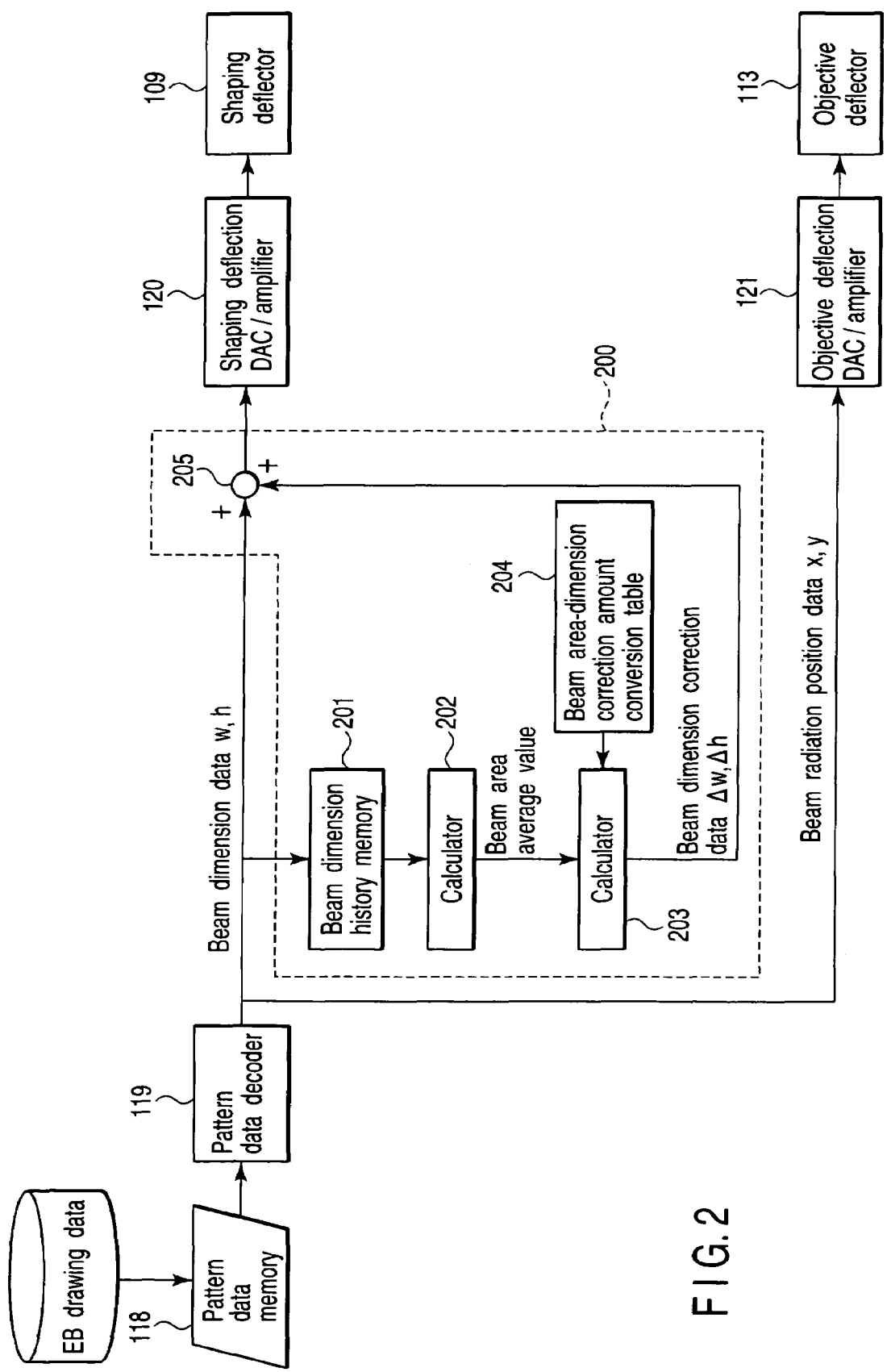
F I G. 2

$$\begin{cases} S1, & S2, & \text{------------}, Sn \\ \hline \Delta X1, & \Delta X2, & \text{------------}, \Delta Xn \\ \Delta Y1, & \Delta Y2, & \text{------------}, \Delta Yn \end{cases}$$

CHARGED BEAM EXPOSURE APPARATUS AND METHOD FOR MANUFACTURING MASK AND SEMICONDUCTOR DEVICE

CROSS-REFERENCE TO RELATED APPLICATIONS

This application is based upon and claims the benefit of priority from prior Japanese Patent Application No. 2005-082434, filed Mar. 22, 2005, the entire contents of which are incorporated herein by reference.

BACKGROUND OF THE INVENTION

1. Field of the Invention

The present invention relates to a charged beam exposure apparatus, a charged beam exposure method, a method of manufacturing a mask, and a method of manufacturing a semiconductor device, which are used in semiconductor process.

2. Description of the Related Art

As one of lithography processes in semiconductor manufacturing processes, there is a photolithography process. The photolithography process has advantages including an easy-to-use process, a low cost performance, and the like. Therefore, the photolithography process is used widely in device production.

In the photolithography process, innovations are always made continuously. For example, in recent years, ultrafine elemental devices of a 0.1 µm level have been nearly attained through the introduction of a short wavelength (adaptation of an ArF excimer laser light source). For further ultrafine elemental devices, an immersion exposure apparatus in which a region between an objective lens and a surface of sample is immersed in liquid has been under its development. This type of exposure apparatus is expected to become a mass production lithography tool for the 65 nm rule generation.

However, in realizing the immersion exposure apparatus, the time concerning the development of the next-generation lithography technology has been prolonged, and it is worried that it may not catch up with the speed of miniaturization of devices.

On the other hand, it has been substantiated that an electron beam (EB) lithography process enables processing down to 10 nm by use of a thin narrowed electron beam. From the viewpoint of the miniaturization, the process will not have problems for some time to come. Nevertheless, concerning the dimensional precision and positional precision of drawn patterns, the process has the following problem. That is, the process has the problem that there occur a beam dimension error and a beam exposure position error depending on the cross-sectional area of the electron beam.

In an electron beam drawing apparatus of a variably shaped beam type, an electron beam is emitted from an electron gun. The electron beam passes through the first shaping aperture mask. The electron beam having passed through the first shaping aperture mask is irradiated onto the second shaping aperture mask. Dimensions of the beam that reaches onto a sample through the second shaping aperture mask is controlled by controlling a position of the beam that is irradiated onto the second shaping aperture mask.

When a fine pattern is drawn, in other words, when a fine beam is irradiated onto the sample, most of the electron beam is cut by the second shaping aperture mask. Therefore, most of the electron beam energy is absorbed in the second shaping aperture mask.

On the other hand, when a large area pattern is drawn, in other words, when a large area beam is irradiated onto the sample, the amount of the electron beam cut by the second shaping aperture mask is extremely small. Therefore, only a little amount of the electron beam energy is absorbed in the second shaping aperture mask.

Thus, in the case of drawing the fine pattern, the amount of the electron beam energy that is absorbed into the second shaping aperture mask is larger than in the case of drawing the large area pattern. Accordingly, the heat quantity that is given to the second shaping aperture mask becomes larger in the case of drawing the fine pattern than in the case of drawing the large area pattern. Therefore, the thermal expansion of the second shaping aperture mask becomes larger in the case of drawing the fine pattern than in the case of drawing the large area pattern.

Such the difference in the heat quantity absorbed in the second shaping aperture mask causes temperature fluctuation in the second shaping aperture mask, and as a result, thermal expansion changes occur in the second shaping aperture mask. Then, owing to such thermal expansion changes, a position of an opening (aperture) in the second shaping aperture mask changes, and in a conspicuous case, there occurs a distortion in the opening shape. These changes of the opening position and the distortion of the opening shape become factors to cause a dimension error of the electron beam which passes through the second shaping aperture mask or an irradiation position error of the electron beam on a sample (Japanese Patent No. 3431445).

Also, even in the case of a character projection type (partial entire exposure type) exposure apparatus or an electron beam projection lithography (EPL) type exposure apparatus (large area transfer exposure apparatus) that transfers a mask pattern by use of an electron beam, there occur similar problems.

More specifically, the heat quantity that the electron beam supplies to a mask differs due to differences in an opening ratio of a partial entire exposure transfer mask (character aperture mask), and an opening ratio of an EPL mask, and accordingly, temperature fluctuations occur in the mask during exposure. As a result, there occurs a change in the thermal expansion of the mask, and a position of the opening in the mask changes, and in a conspicuous case, there occurs a distortion in the opening shape. These changes of the opening position and the distortion of the opening shape become factors to cause a dimension error of a transferred pattern (for example, a resist pattern) on a wafer or an irradiation position error of the electron beam on a wafer.

BRIEF SUMMARY OF THE INVENTION

According to an aspect of the present invention, there is provided a charged beam exposure apparatus comprising: a charged beam radiating unit configured to radiate a charged beam; a shaping unit including an opening for shaping the charged beam; a storage unit configured to store a history of data concerning a beam area of the charged beam on the shaping unit; a deflecting unit configured to irradiate the charged beam onto a desired position on a sample by deflecting the charged beam which has passed through the opening of the shaping unit; a calculating unit configured to calculate an average value of the beam area of the charged beam on the shaping unit in a given period of time based on the history of the data concerning the beam area of the charged beam stored in the storage unit; a predicting unit configured to predict at least one of change amount of dimensions of the charged beam passing through the opening to design dimensions of the opening and change amount of an irradiation position of the charged beam on the sample which are corresponding to the average value calculated by the calculating unit, the predicting the at least one of change amounts being carried out based on at least one of a relation between the beam area of the charged beam on the shaping unit previously prepared and change amount of the dimensions of the charged beam passing through the opening to the design dimensions of the opening for shaping the charged beam, and a relation between the beam area of the charged beam on the shaping unit previously prepared and change amount of the irradiation position of the charged beam on the sample; and a correcting unit configured to correct at least one of dimensions of a pattern which corresponds to the charged beam and is to be formed on the sample, a beam irradiation time and a beam irradiation position based on the change amount predicted by the predicting unit.

According to an aspect of the present invention, there is provided a charged beam exposure method using a charged beam exposure apparatus comprising a charged beam radiating unit configured to radiate a charged beam; a shaping unit including an opening for shaping the charged beam; and a deflecting unit configured to irradiate the charged beam onto a desired position on a sample by deflecting the charged beam which has passed through the opening of the shaping unit, the method comprising: storing a history of data concerning a beam area of the charged beam on the shaping unit; calculating an average value of the beam area of the charged beam on the shaping unit in a given period of time based on the stored history of the data concerning the beam area of the charged beam; a predicting unit configured to predict at least one of change amount of dimensions of the charged beam passing through the opening to design dimensions of the opening and change amount of an irradiation position of the charged beam on the sample which are corresponding to the average value calculated by the calculating unit, the predicting the at least one of change amounts being carried out based on at least one of a relation between the beam area of the charged beam on the shaping unit previously prepared and change amount of the dimensions of the charged beam passing through the opening to the design dimensions of the opening for shaping the charged beam, and a relation between the beam area of the charged beam on the shaping unit previously prepared and change amount of the irradiation position of the charged beam on the sample; and correcting the charged beam based on the predicted change amount.

According to an aspect of the present invention, there is provided a method of manufacturing a mask comprising: preparing a sample comprising a transparent substrate, a light shielding film provided on the transparent substrate, and a resist applied on the light shielding film; exposing the resist to a charged beam while correcting the charged beam using a charged beam exposure apparatus of claim 1 such that at least one of dimensions and a position of a resist pattern which corresponds to the charged beam and is to be formed on the sample become a predetermined value; forming the resist pattern by developing the resist; and etching the light shielding film using the resist pattern as a mask.

According to an aspect of the present invention, there is provided a method of manufacturing a semiconductor device comprising: preparing a sample comprising a substrate including a semiconductor substrate, and a resist provided on the substrate; exposing the resist to light including irradiating light onto a mask, the mask being manufactured by a mask manufacturing method of claim 11, and irradiating the light which has passed through the mask onto the resist; and forming a resist pattern by developing the resist.

According to an aspect of the present invention, there is provided a method of manufacturing a semiconductor device using a charged beam exposure apparatus, the charged beam exposure apparatus comprising a charged beam radiating unit configured to radiate a charged beam; a shaping unit including an opening for shaping the charged beam; a deflecting unit configured to irradiate the charged beam onto a desired position on a sample by deflecting the charged beam which has passed through the opening of the shaping unit; the method of manufacturing the semiconductor device comprising: storing a history of data concerning a beam area of the charged beam on the shaping unit; calculating an average value of the beam area of the charged beam on the shaping unit in a given period of time based on the stored history of the data concerning the beam area of the charged beam; a predicting unit configured to predict at least one of change amount of dimensions of the charged beam passing through the opening to design dimensions of the opening and change amount of an irradiation position of the charged beam on the sample which are corresponding to the average value calculated by the calculating unit, the predicting the at least one of change amounts being carried out based on at least one of a relation between the beam area of the charged beam on the shaping unit previously prepared and change amount of the dimensions of the charged beam passing through the opening to the design dimensions of the opening for shaping the charged beam, and a relation between the beam area of the charged beam on the shaping unit previously prepared and change amount of the irradiation position of the charged beam on the sample; and correcting the charged beam based on the predicted change amount.

BRIEF DESCRIPTION OF THE SEVERAL VIEWS OF THE DRAWING

FIG. 2 is a diagram showing an example of a specific configuration of a correcting mechanism according to the first embodiment;

DETAILED DESCRIPTION OF THE INVENTION

Embodiments of the present invention will be illustrated in more details with reference to the accompanying drawings hereinafter.

First Embodiment

Figure 1:
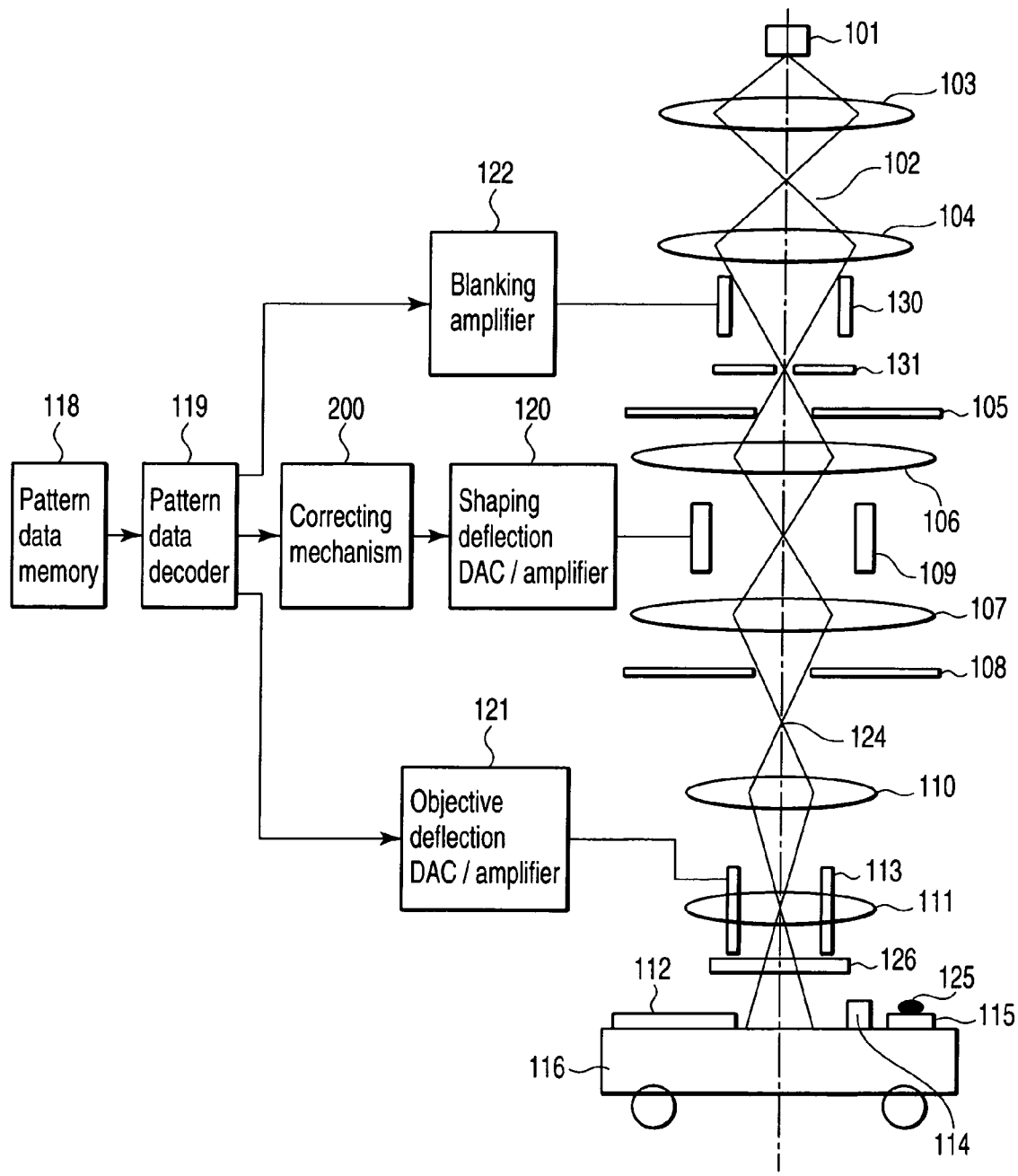
FIG. 1 is a diagram showing a schematic configuration of an electron beam drawing apparatus of a variably shaped beam type according to a first embodiment.

FIG. 1 is a diagram showing a schematic configuration of an electron beam drawing apparatus of a variably shaped beam type according to a first embodiment.

The electron beam drawing apparatus of the present embodiment comprises a correcting mechanism 200 provided between a pattern data decoder 119 and a shaping deflection digital-analog converter (DAC)/amplifier 120. FIG. 2 schematically shows an example of a specific configuration of the correcting mechanism 200.

The electron beam drawing apparatus of the present embodiment comprises an electron gun 101 for emitting an electron beam 102, the second shaping aperture mask 108 including an opening for shaping the electron beam 102 that is emitted from the electron gun 101 and has passed through the first shaping aperture mask 105, a beam dimension history memory 201 for storing a data history concerning a beam area of the electron beam 102 on the second shaping aperture mask 108, an objective deflector 113 for deflecting the electron beam 102 that is emitted from the electron gun 101 and has passed through the second shaping aperture mask 108 onto a desired position on a sample 112, a calculator 202 for calculating an average value of the beam area of the electron beam 102 on the second shaping aperture mask 108 in a given period of time based on the data history concerning the beam area of the electron beam 102 stored in the beam dimension history memory 201, a calculator 203 for predicting change amount of dimensions of the electron beam 102 which passes through an opening (aperture) of the second shaping aperture mask 108 to design dimensions of the opening (hereinafter referred to as design aperture dimensions) corresponding to the average value calculated by the calculator 203 based on a relation between an electron area of the electron beam 102 on the second shaping aperture mask 108 previously prepared and the design aperture dimensions of second shaping aperture mask 108, and an adder 205 for correcting the electron beam 102 based on the change amount predicted by the calculator 203.

The electron beam 102 emitted from the electron gun 101, the current density and the Kohler illumination condition thereof are adjusted by the first condenser lens 103 and the second condenser lens 104, thereby the electron beam illuminates the first shaping aperture mask 105 uniformly. An image of the first shaping aperture mask 105 is imaged on the second shaping aperture mask 108 by the first projection lens 106 and the second projection lens 107. The second shaping aperture mask 108 is held by a holding unit (not shown).

On the second shaping aperture mask 108, there are arranged a plurality of openings for shaping the electron beam 102. According to the dimensions defined in drawing data, the electron beam 102 is irradiated onto a position that passes through part of the plurality of openings. The position (irradiation position) of the electron beam 102 on the second shaping aperture mask 108 is controlled by deflecting the electron beam 102 by a shaping deflection system.

The shaping deflection system comprises a shaping deflector 109 and the shaping deflection DAC/amplifier 120. The shaping deflection DAC/amplifier 120 converts deflection data (digital data) sent from the pattern data decoder 119 into analog data. The deflection data includes dimension data of the electron beam 102 on the second shaping aperture mask 108. The dimension data includes dimension data w of a width (horizontal dimension) of the electron beam 102 and dimension data h of a height (vertical dimension) thereof.

The shaping deflection DAC/amplifier 120 applies a voltage corresponding to the size (amplitude) of the analog data to the shaping deflector 109. The pattern data decoder 119 decodes drawing control data read from the pattern data memory 118, and thereby generates the deflection data.

Here, in the case of the present embodiment, the beam dimension data w, h sent from the pattern data decoder 119 are not sent directly to the shaping deflection DAC/amplifier 120, but deflection (correction deflection data) data once corrected by the correcting mechanism 200 is sent to the shaping deflection DAC/amplifier 120.

The correcting mechanism 200 shown in FIG. 2 comprises the beam dimension history memory 201 for storing the beam dimension data w, h sent to the shaping deflection DAC/amplifier 120 from the pattern data decoder 119, the calculator 202 for calculating an average value of the beam area (beam area average value) of the electron beam 102 on the second shaping aperture mask 108 in a given period of time based on the beam dimension data w, h read from the beam dimension history memory 201, the calculator 203 for predicting beam dimension correction data $\Delta w$, $\Delta h$ based on the beam area average value calculated by the calculator 202 and a beam area-dimension correction amount conversion table 204 to be described later, and an adder 205 for adding the beam dimension correction data $\Delta w$, $\Delta h$ predicted by the calculator 203 and the beam dimension data w, h sent from the pattern data decoder 119 in order to generate correction deflection data.

An output of the adder 205 (correction deflection data) is input to the shaping deflection DAC/amplifier 120. The shaping deflection DAC/amplifier 120 generates a voltage in consideration of a dimension error arising from temperature fluctuations (thermal expansion) occurring in the second shaping aperture mask 108 on the basis of the correction deflection data. The voltage considering the dimension error is applied to the shaping deflector 109.

Consequently, the position of the electron beam 102 to be irradiated onto the second shaping aperture mask 108 is controlled such that a pattern (for example, a resist pattern) corresponding to the electron beam 102 shaped by the second shaping aperture mask 108 and to be formed on the sample 112, has a predetermined dimension (design dimension).

The electron beam 102 having passed through the second shaping aperture mask 108 is reduced and projected by a reducing lens 110 and an objective lens 111 respectively, and is imaged on the sample 112. The position (irradiation position) of the electron beam 102 on the sample 112 is controlled by deflecting the electron beam 102 by the objective deflection system and controlling the beam irradiation position on the sample 112.

The sample 112 comprises, for example, a transparent substrate, a light shielding film provided on the transparent substrate, and a resist applied on the light shielding film. That is, the sample comprises mask blanks and a resist applied thereon. In this case, the resist is processed into a resist pattern that is used when the light shielding film is etched to form a pattern after exposure and development.

Further, the sample 112 comprises, for example, a substrate including a semiconductor substrate such as a Si substrate or an SOI substrate, and a resist applied on the substrate. The substrate may have further a film such as an insulation film. In this case, the resist is processed into a resist pattern that is used when the insulation film is etched to form contact holes, via holes or wiring trench after exposure and development.

The objective deflection system includes the objective deflector 113 and an objective deflection DAC/amplifier 121. The objective deflection DAC/amplifier 121 converts beam position data (digital data) sent from the pattern data decoder 119 into analog data, and further applies a voltage corresponding to the size (amplitude) of the analog data to the objective deflector 113. The pattern data decoder 119 decodes drawing control data read from the pattern data memory 118, and thereby generates the beam position data.

The sample 112 is set on a moving stage 116 together with a Faraday cup 114 and an electron beam measurement mark board 115. Moving the moving stage 116 makes it possible to select an arbitrary objective from among plural objectives (the sample 112, the Faraday cup 114, and the electron beam measurement mark board 115) to which the electron beam 102 is irradiated.

In the case where the position of the electron beam 102 on the sample 112 is moved, the electron beam 102 is deflected by a blanking deflection system such that unnecessary portions on the sample 112 are not exposed, and the electron beam 102 is cut by a blanking aperture 131 so as not to reach onto the sample 112.

The blanking deflection system comprises a blanking electrode 130 and a blanking amplifier 122. The blanking amplifier 122 applies a voltage corresponding to ON/OFF data sent from the pattern data decoder 119 to the objective deflector 113. The pattern data decoder 119 decodes the drawing control data read from the pattern data memory 118, and thereby generates the ON/OFF data.

When the voltage corresponding to the OFF data is applied to the objective deflector 113, the electron beam 102 is cut by the blanking aperture 131, and accordingly, the electron beam 102 does not reach onto the sample 112. On the other hand, when the voltage corresponding to the ON data is applied to the objective deflector 113, the electron beam 102 is not cut by the blanking aperture 131, and accordingly, the electron beam 102 reaches onto the sample 112. Consequently, the time period in which the electron beam 102 is radiated onto the sample 112 (beam exposure time period) can be controlled by the blanking deflection system.

As is known from the above explanation, the pattern data memory 118 stores all the drawing control data concerning shaping deflection, objective deflection, and blanking deflection. Further, in FIG. 1, reference numeral 124 denotes a crossover of the electron beam 102 that has passed through the second shaping aperture mask 108.

Figure 3:
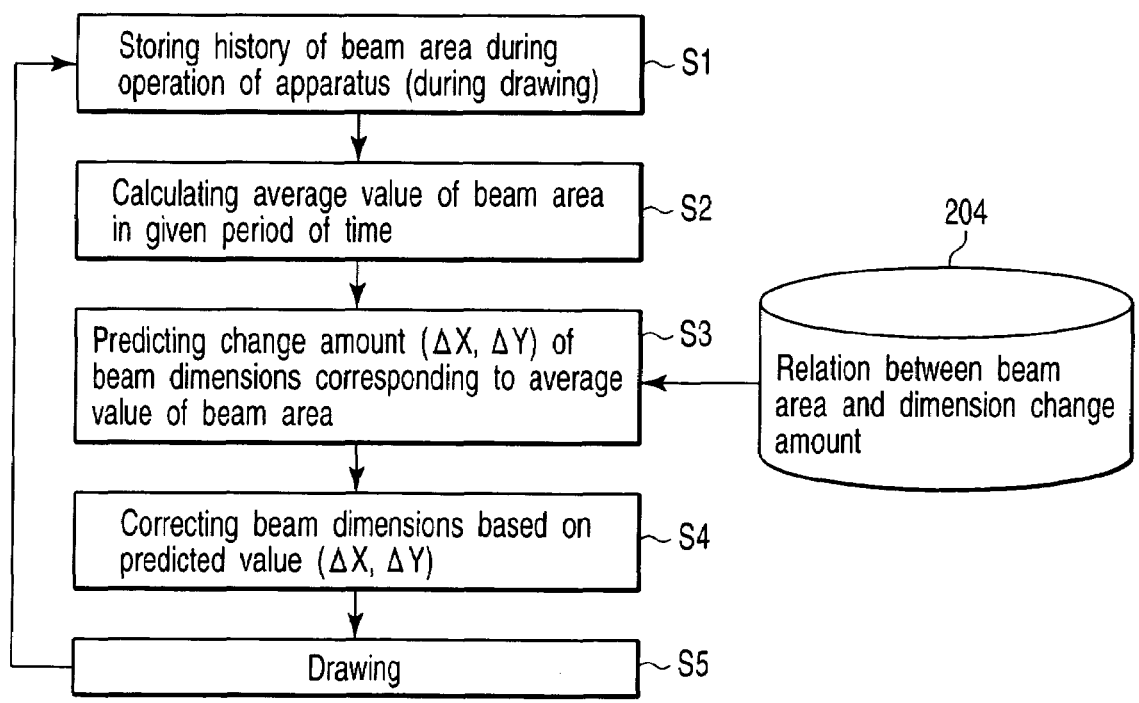
FIG. 3 is a flow chart showing a first drawing method according to the first embodiment.

FIG. 3 is a flow chart showing a drawing method of the present embodiment.

First, the electron beam drawing apparatus is activated to store history of data concerning the beam area of the electron beam 102 on the second shaping aperture mask 108 during drawing (step S1). This is carried out by causing the beam dimension history memory 201 to store the beam dimension data w, h. The beam area of the electron beam 102 is given by the product of the beam dimension data w and the beam dimension data h. In the place of the beam dimension data w, h, the beam area itself of the electron beam 102 may be stored.

Next, on the basis of the history of the data concerning the beam area of the electron beam stored in step S1, an average value of the beam area (beam area average value) of the electron beam 102 on the second shaping aperture mask 108 in a given period of time is calculated (step S2). This is carried out by the calculator 202.

Figures 4, 5:
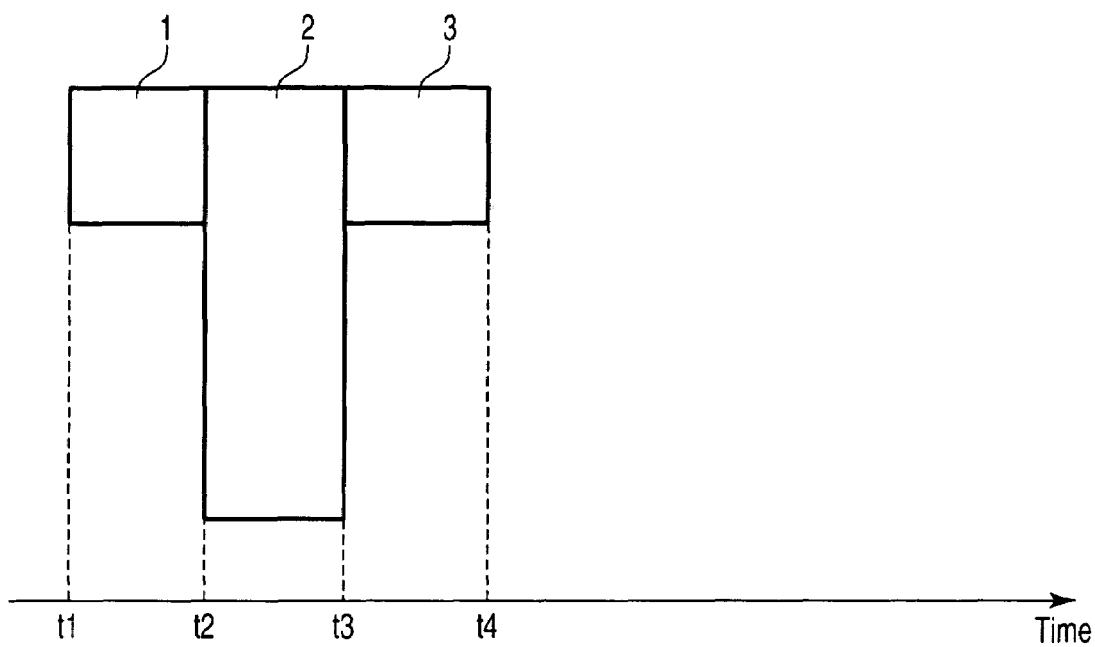
FIG. 4 is a view for explaining a method of calculating an average value of an area of an electron beam in a given period of time.
FIG. 5 is a view showing an example of a table in which an area of an electron beam and the change amount of dimensions of an aperture in a second shaping aperture mask are corresponded.

For example, as shown in FIG. 4, in the case where, in order to draw a character T, a rectangular pattern 1 of an area 1 $\mu m^2$ is drawn for a period from time t1 to time t2 (1 $\mu sec$); a line pattern 2 of an area 3 $\mu m^2$ is drawn for a period from time t2 to time t3 (1 $\mu sec$); and a rectangular pattern 3 of an area 1 $\mu m^2$ is drawn for a period from time t3 to time t4 (1 $\mu sec$), the average value of the area of the electron beam becomes $(1+3+1)/3=5/3$.

Next, on the basis of the beam area average value calculated in step S2 and the beam area—dimension correction amount conversion table 204 obtained in advance, the change amount of dimensions of the electron beam that has passed through the second shaping aperture mask to design aperture dimensions is calculated, the change amount corresponding to the average value of the area of the electron beam calculated in step S2 (step S3). This is carried out by the calculator 203.

The conversion table 204 has a table in which the beam area of the electron beam 102 on the second shaping aperture mask 108, and the change amount of the dimensions of the electron beam 102 that passes through an opening in the second shaping aperture mask 108 (hereinafter referred as to second shaping aperture) to the design aperture dimensions are corresponded.

The conversion table 204 is, for example as shown in FIG. 5, a table in which an area Si (i=1, . . . , n) of the electron beam on the second shaping aperture mask 108 and the change amount ($\Delta Xi$, $\Delta Yi$ (i=1, . . . , n)) of the dimensions of the second shaping aperture in the case where the electron beam 102 having the area Si is irradiated onto the second shaping aperture mask 108 are corresponded (correlated).

Figure 6A:
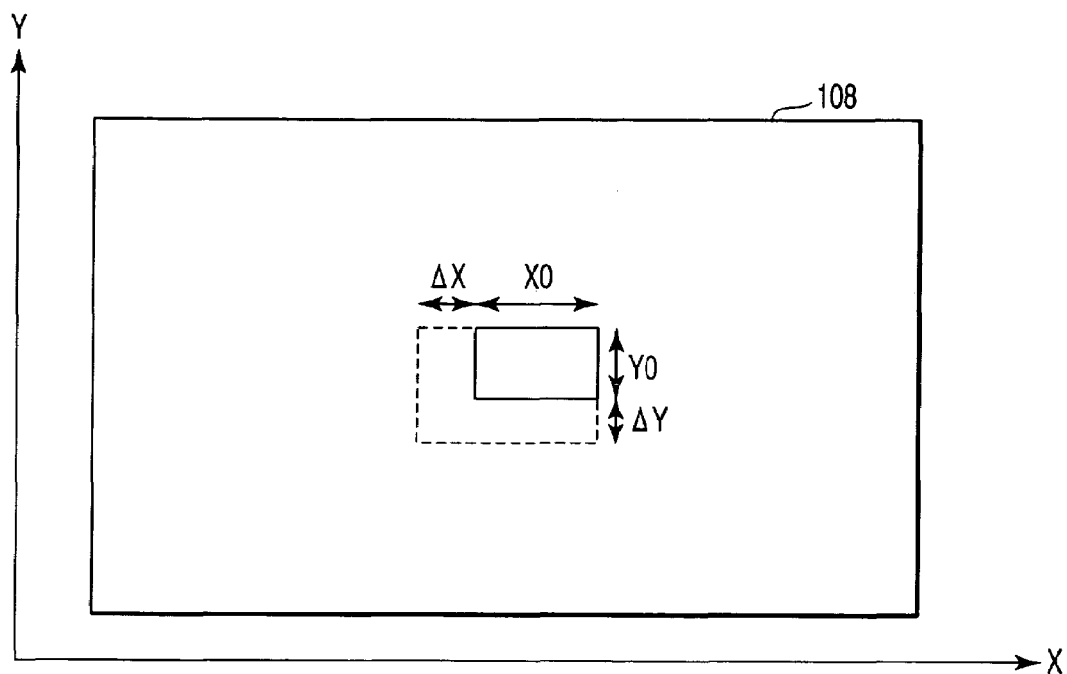
FIGS. 6A and 6B are views each explaining the change amount $\Delta X$, $\Delta Y$ of the dimensions of the aperture in the second shaping aperture mask.
Figure 6B:
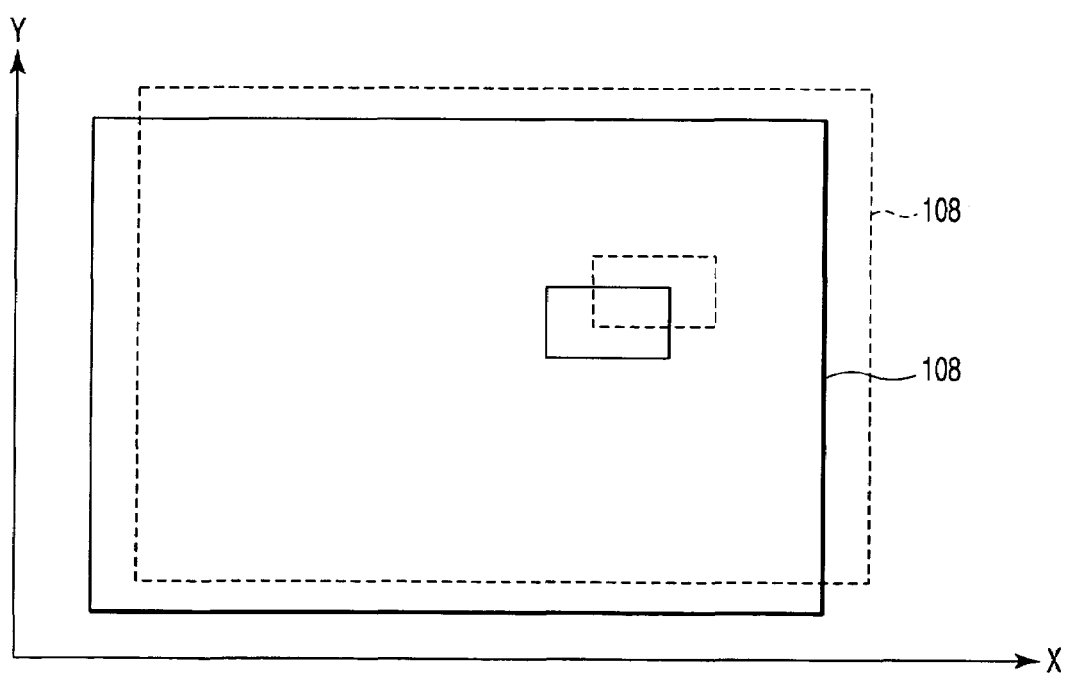

$\Delta X$, $\Delta Y$, as shown in FIG. 6A, show the dimensional change amounts in X direction and Y direction to the second shaping aperture having the design dimensions (X0, Y0), in X-Y orthogonal coordinates. FIG. 6B shows a case where there has occurred a thermal expansion in the second shaping aperture mask 108 due to the irradiation of the electron beam 102, and as a result, the dimensions of the second shaping aperture have increased.

The conversion table in FIG. 5 is one in the case where the position of the second shaping aperture mask 108 does not change. However, when the electron beam 102 is irradiated onto the second shaping aperture mask 108, the position of the second shaping aperture mask 108 may be changed owing to a thermal expansion, as shown in FIG. 6B.

In this case, $\Delta X$, $\Delta Y$ in the conversion table in FIG. 5 may be read, as shown in FIG. 6B, as the dimensional change amounts in the X direction and the Y direction of the second shaping aperture mask 108 shown in a dotted line displaced from a predetermined position owing to thermal expansion, with respect to the second shaping aperture mask 108 shown in a solid line at a predetermined position, in the X-Y orthogonal coordinates.

When the second shaping aperture mask 108 is displaced from a predetermined position, the overlapping amount of the second shaping aperture and the electron beam 102 change. Therefore, even if the dimensions of the second shaping aperture do not change owing to thermal expansion, the dimensions of the electron beam 102 that passes through the second shaping aperture change.

Accordingly, in the place of the change amount of the dimensions of the second shaping aperture, the change amount of the position of the second shaping aperture mask 108 may be used. Alternatively, a conversion table in consideration of the change amount of the dimensions of the second shaping aperture and the change amount of the position of the second shaping aperture mask 108 may be used.

In the case where there is the same area Si as the calculated average value of the electron beam area in the conversion table 204, the change amount corresponding to the area Si is selected as a predicted value. On the other hand, in the case where there is no the same area Si as the calculated average value of the electron beam area in the conversion table 204, for example, a value calculated by interpolation is selected as the predicted value.

Next, on the basis of the change amount of the dimensions predicted in step S3, the position of the electron beam 102 that is irradiated onto the second shaping aperture mask 108 is controlled such that the dimensions of the electron beam 102 that passes through the second shaping aperture mask 108 become the design aperture dimensions (step S4). This is carried out by inputting correction deflection data generated by the adder 205 into the shaping deflection DAC/amplifier 120.

Depending upon the area of the electron beam that is irradiated onto the second shaping aperture mask 108, there occurs a thermal fluctuation in the second shaping aperture mask 108. Along such the thermal fluctuation, the dimensions of the second shaping aperture or the position of the second shaping aperture mask 108 changes.

However, according to the present embodiment, the electron beam 102 is corrected such that the change amount of the dimensions of the electron beam 102 that passes through the second shaping aperture becomes small with respect to the design aperture dimensions (step S4). Consequently, it is possible to increase the dimensional precision of the electron beam 102 that has passed through the second shaping aperture mask 108, and further to increase the dimensional precision of the electron beam 102 on a wafer.

Next, drawing is performed using the electron beam 102 whose dimensions are corrected (step S5). The drawing method in step S5 is same as the well known drawing method except that the electron beam 102 corrected by the method of the present embodiment is employed herein. Accordingly, the operation and driving method of the drawing apparatus of the present embodiment in step S5 are same as the operation and driving method of a conventional drawing apparatus.

Thereafter, the steps S1 to S5 are repeated, and remaining patterns are drawn.

Thus, according to the present embodiment, the dimension error arising from the thermal expansion (temperature fluctuation) of the second shaping aperture mask 108 caused when the energy of the electron beam 102 is irradiated onto the second shaping aperture mask 108 is predicted, and the position of the electron beam 102 that is irradiated onto the second shaping aperture mask 108 is corrected such that the predicted dimension error becomes small, thereby a charged beam exposure apparatus and a charged beam exposure method with high drawing precision is realized.

Second Embodiment

Figure 7:
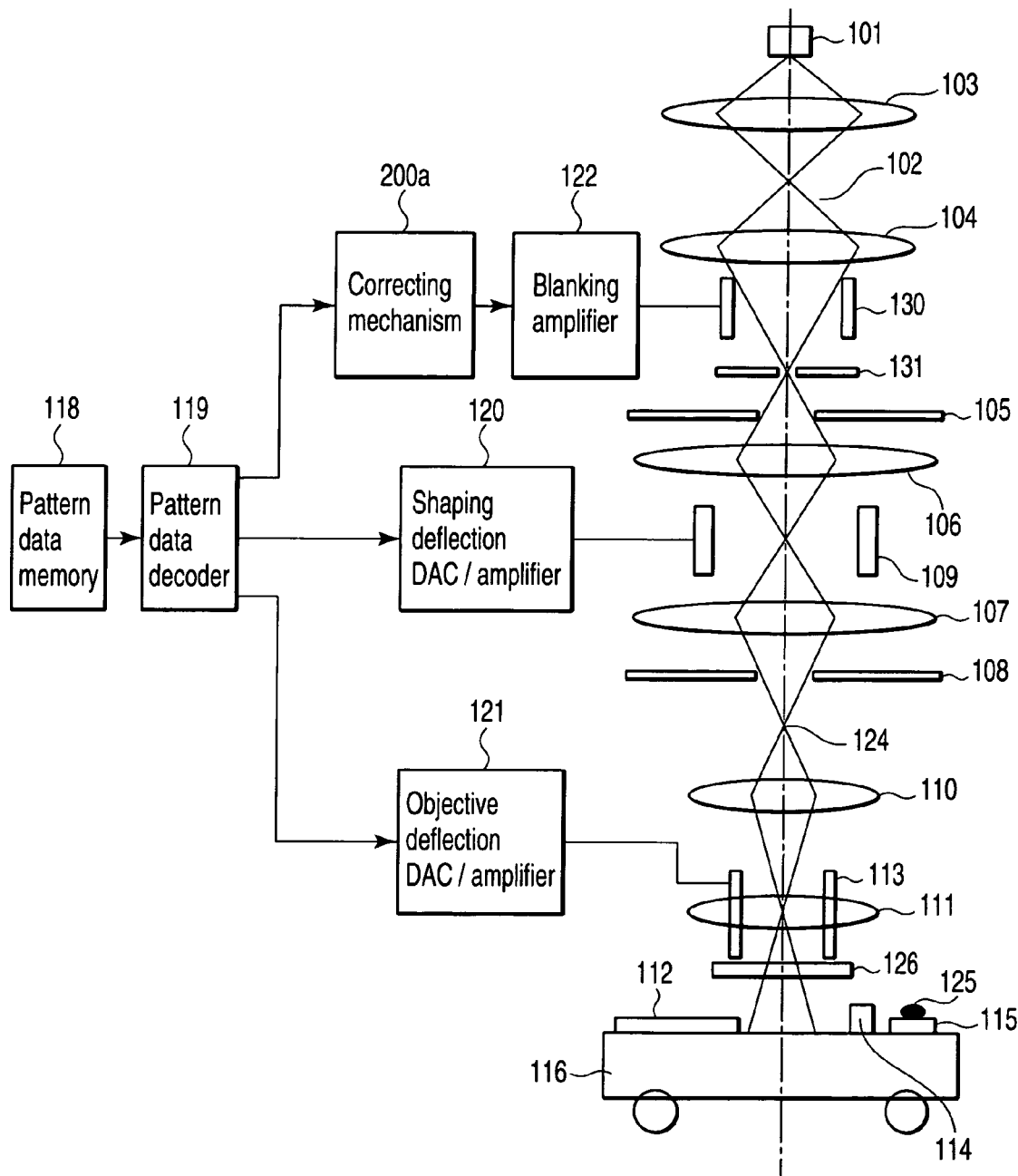
FIG. 7 is a diagram showing a schematic configuration of an electron beam drawing apparatus of a variably shaped beam type according to a second embodiment.
Figure 8:
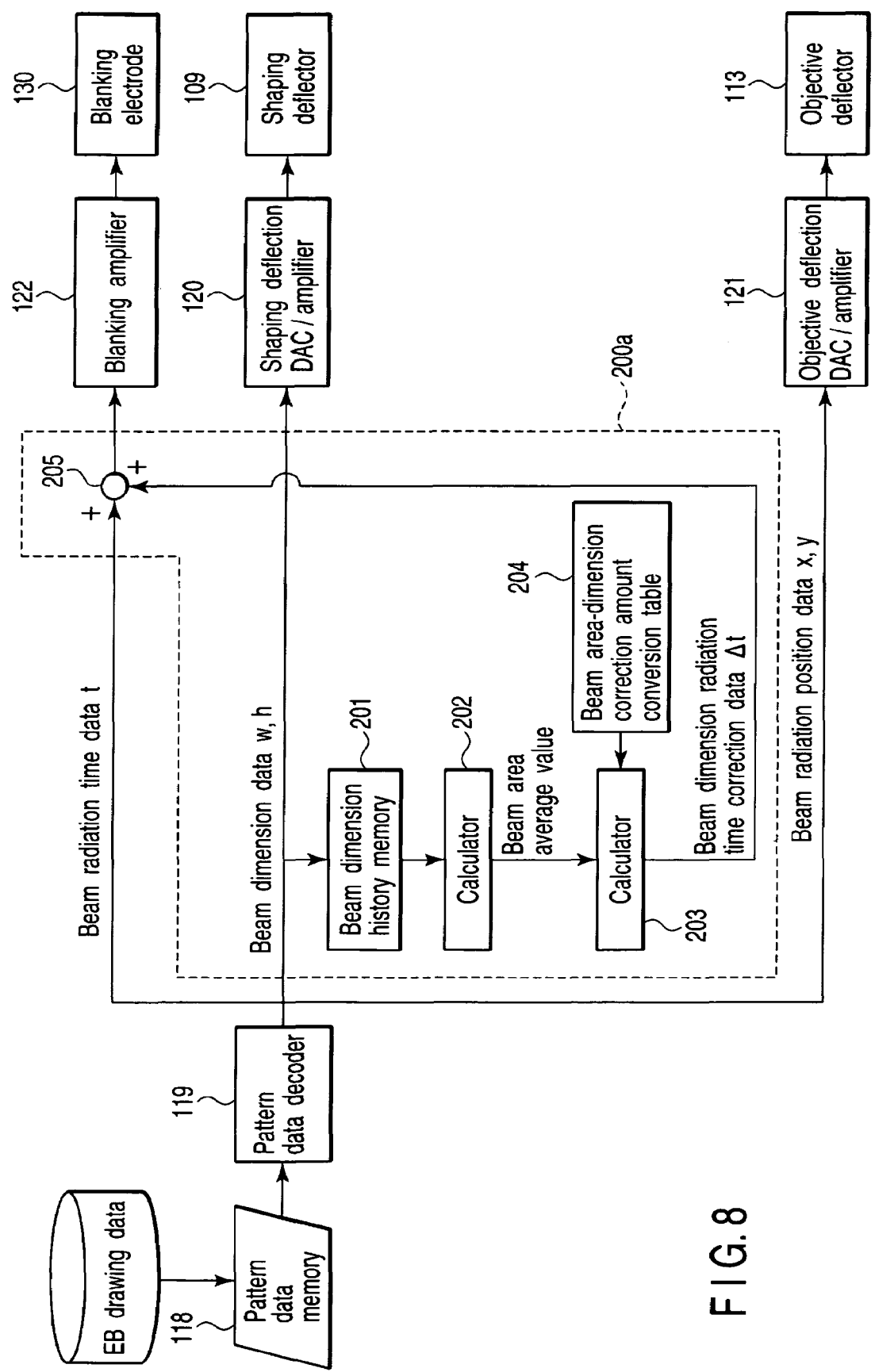
FIG. 8 is a diagram schematically showing an example of a specific configuration of a correcting mechanism of the electron beam drawing apparatus according to the second embodiment.

FIG. 7 is a diagram showing a schematic configuration of an electron beam drawing apparatus of a variably shaped beam type according to the second embodiment. FIG. 8 is a diagram schematically showing an example of a specific configuration of a correcting mechanism 200*a* of the electron beam drawing apparatus according to the second embodiment. The same components as those shown in the figures described above are denoted by the same reference numerals in FIG. 7 and the following figures, and the detailed description thereof is omitted.

The present embodiment is different from the first embodiment in that the ON/OFF data to be input to the blanking amplifier 122 is controlled so as to correct the electron beam 102, thereby the dimension error arising from the temperature fluctuation (thermal expansion) that occurs in the second shaping aperture is prevented from occurring.

The correcting mechanism 200*a* of the present embodiment is, as shown in FIG. 7, provided between the pattern data decoder 119 and the blanking amplifier 122. In the first embodiment, the beam dimension correction data Δw, Δh are predicted by the calculator 203, however, in the present embodiment, beam irradiation time correction data Δt is predicted.

For example, in the case where the electron beam is irradiated onto a positive type resist of the sample 112, the amount (exposure amount) of the electron beam 102 that the positive type resist receives becomes large if the beam radiation time period is long, and accordingly, the dimensions of the positive type resist pattern (dimensions of the resist left after development) become small. On the other hand, if the bean irradiation time is short, the exposure amount becomes small, and accordingly, the dimensions of the positive type resist pattern become large. Because the beam irradiation time period is determined by the ON/OFF data, correcting the ON/OFF data makes it possible to prevent the dimension error of the positive type resist pattern from occurring.

The calculator 203 of the present embodiment predicts the beam irradiation time correction data Δt corresponding to the dimension correction amount based on the beam area average value and the beam area-dimension correction amount conversion table 204. In a case where the electron beam is irradiated onto the positive type resist of the sample 112, as is known from the above explanation, if the dimension correction value is positive, negative beam irradiation time correction data Δt is predicted, and if the dimension correction value is negative, positive beam irradiation time correction data Δt is predicted.

The adder 205 of the present embodiment adds the beam irradiation time correction data Δt predicted by the calculator 203 to the beam irradiation time data t sent from the pattern data decoder 119, and thereby generates corrected ON/OFF data (correction ON/OFF data). An output of the adder 205 (correction ON/OFF data) is sent to the blanking amplifier 122. The blanking amplifier 122 outputs a voltage corresponding to the correction ON/OFF data (correction voltage). The correction voltage is applied to the blanking electrode 130. Thereby, the beam irradiation time period is controlled such that desired pattern dimensions are obtained.

Thus, according to the present embodiment as well, in the same manner as in the first embodiment, the dimension error arising from the thermal expansion (temperature fluctuation)

of the second shaping aperture mask 108 caused when the energy of the electron beam 102 is irradiated onto the second shaping aperture mask 108 is predicted, and the beam irradiation time period of the electron beam 102 that is irradiated onto the second shaping aperture mask 108 is corrected such that the predicted dimension error becomes small, thereby, a charged beam exposure apparatus and a charged beam exposure method with high drawing precision is realized.

Third Embodiment

Figure 9:
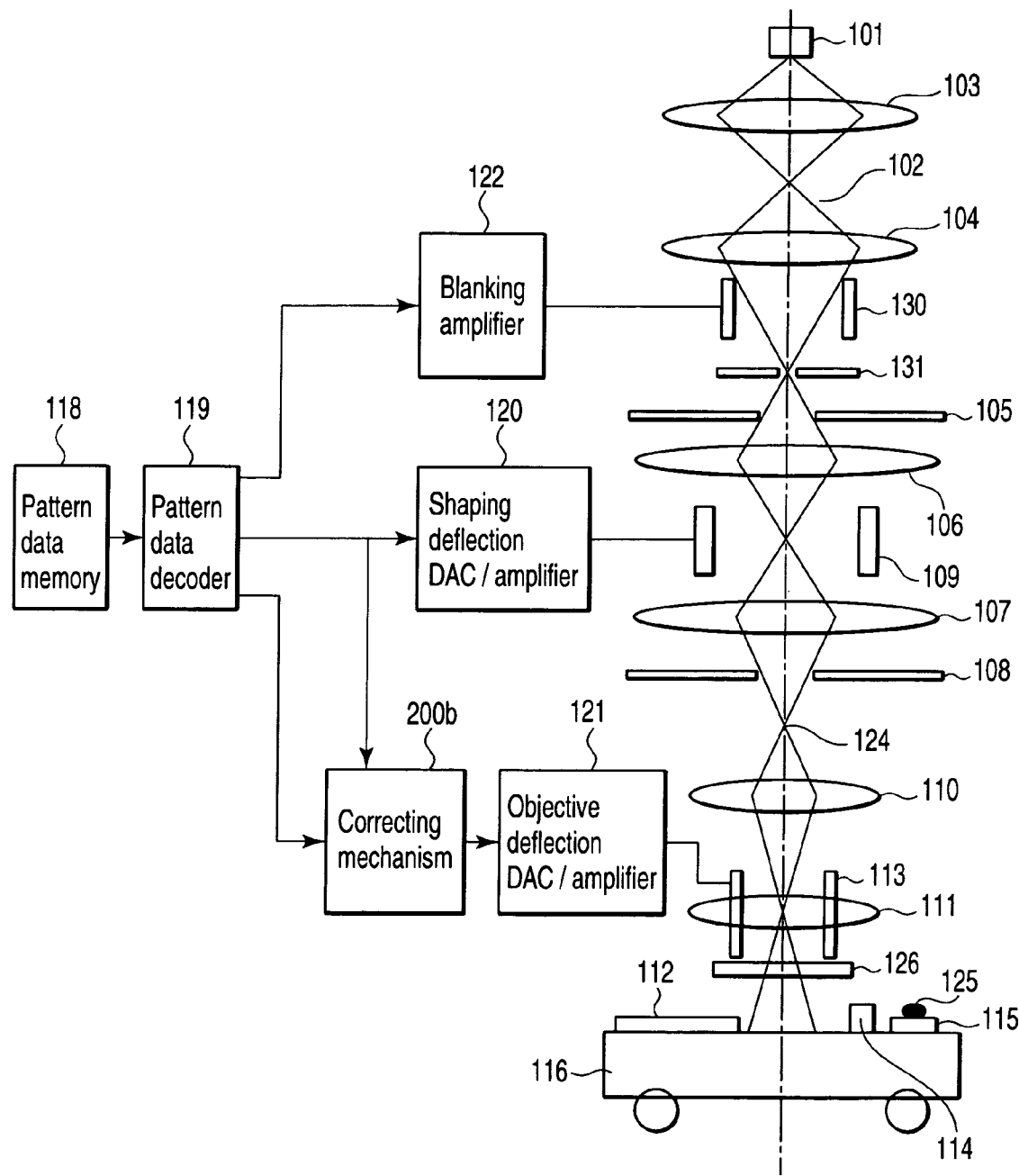
FIG. 9 is a diagram showing a schematic configuration of an electron beam drawing apparatus of a variably shaped beam type according to a third embodiment.
Figure 10:
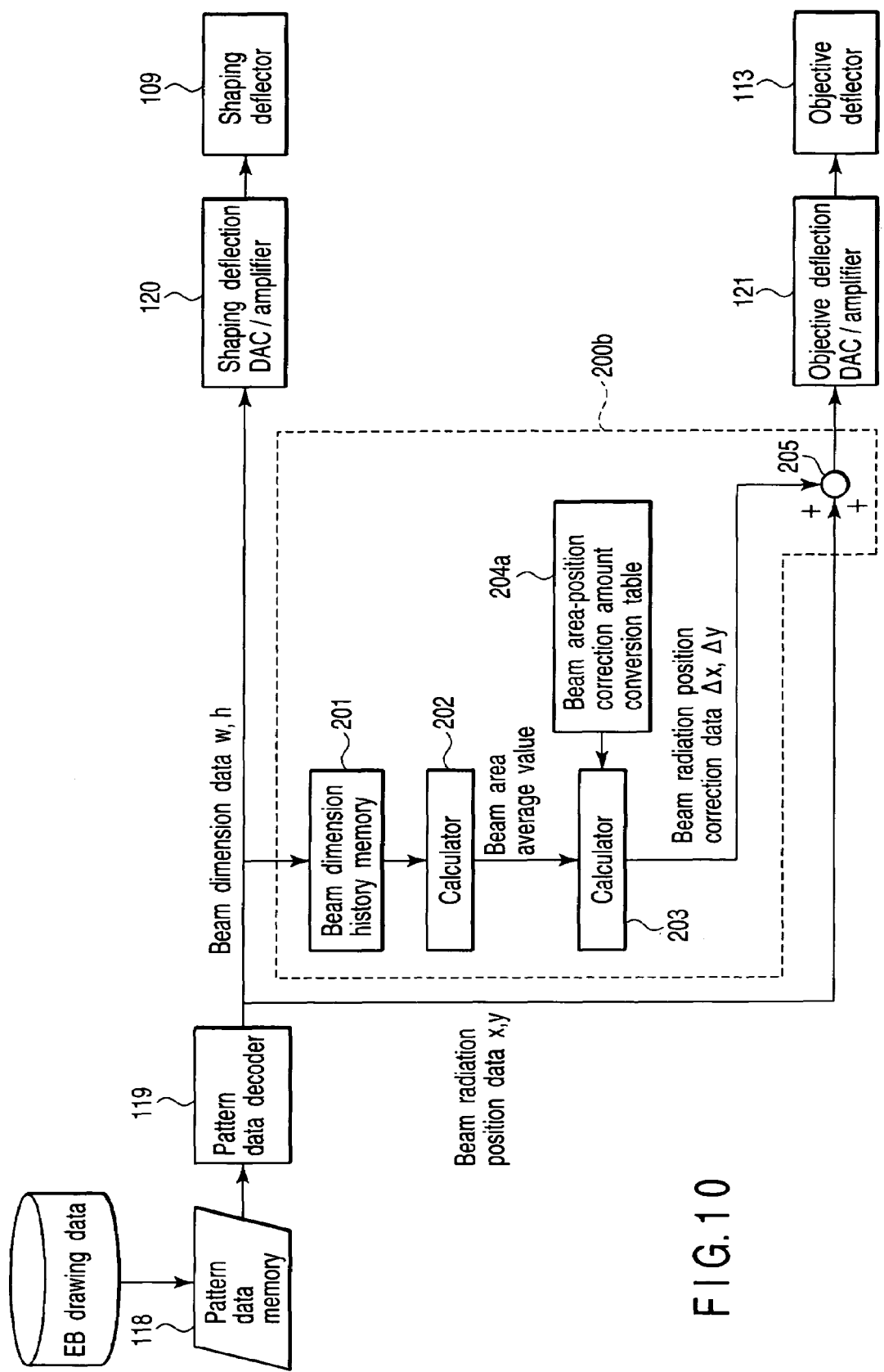
FIG. 10 is a diagram schematically showing an example of a specific configuration of a correcting mechanism of the electron beam drawing apparatus according to the third embodiment.

FIG. 9 is a diagram showing a schematic configuration of an electron beam drawing apparatus of a variably shaped beam type according to a third embodiment. FIG. 10 is a diagram schematically showing an example of a specific configuration of a correcting mechanism 200b of the electron beam drawing apparatus of the third embodiment.

The present embodiment is different from the first embodiment in that beam position data to be input to the objective deflection DAC/amplifier 121 is controlled to correct the electron beam 102, thereby the dimension error arising from the temperature fluctuation (thermal expansion) that occurs in the second shaping aperture is prevented from occurring.

The correcting mechanism 200b of the present embodiment is, as shown in FIG. 9, provided between the pattern data decoder 119 and the objective deflection DAC/amplifier 121. In the first embodiment, the beam dimension correction data $\Delta w$, $\Delta h$ are predicted by the calculator 203, however, in the present embodiment, beam irradiation position correction data $\Delta x$, $\Delta y$ are predicted.

The calculator 203 of the present embodiment predicts the beam irradiation position correction data $\Delta x$, $\Delta y$ corresponding to the predicted beam area average value on the basis of the beam area average value and a beam area-position correction amount conversion table 204a previously prepared.

The adder 205 of the present embodiment adds the beam irradiation position correction data $\Delta x$, $\Delta y$ predicted by the calculator 203 to the beam irradiation position data x, y sent from the pattern data decoder 119, and thereby generates corrected beam irradiation position data (correction beam irradiation position data). An output of the adder 205 (correction beam irradiation position data) is sent to the objective deflection DAC/amplifier 121. The objective deflection DAC/amplifier 121 outputs a voltage corresponding to the correction beam irradiation position data (correction voltage). The correction voltage is applied to the objective deflector 113. Thereby, the voltage to be applied to the objective deflector 113 is controlled such that the electron beam 102 is irradiated onto a predetermined position.

Figure 11:
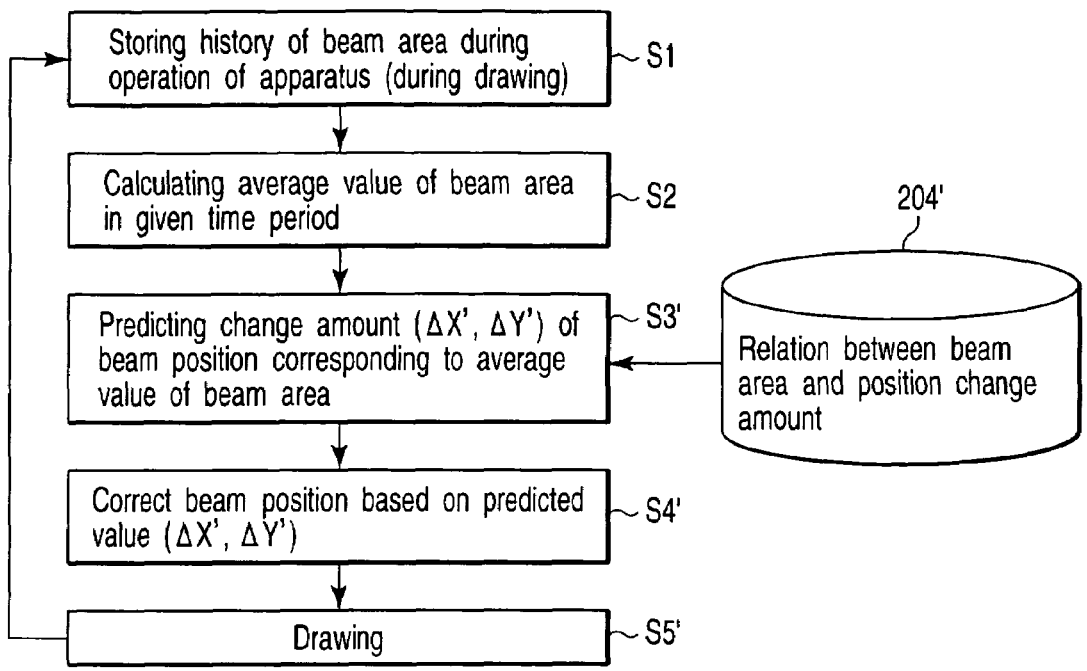
FIG. 11 is a flow chart showing a second drawing method according to the third embodiment.

FIG. 11 is a flow chart showing the second drawing method of the present embodiment. The second drawing method is different from the first drawing method in FIG. 3 in that the change amount of the electron beam irradiation position on a wafer is predicted, and that the electron beam position is corrected on the basis of the predicted change amount.

First, the electron beam drawing apparatus is activated to store a history of an area of the electron beam during drawing (step S1).

Next, on the basis of the history of the area of the electron beam stored in step S1, an average value of the area of the electron beam in a given period of time is calculated (step S2).

Next, on the basis of the conversion table 204a, the change amount of the electron beam irradiation position on the wafer corresponding to the average value of the area of the electron beam calculated in step S2 is predicted (step S3').

The conversion table 204a has a table in which the area of the electron beam and the change amount of the electron beam irradiation position on the wafer are corresponded (correlated). The table 204 is, for example, a table in which an area Si (i=1, ..., n) of the electron beam on the second shaping aperture mask, and the change amount ($\Delta Xi'$, $\Delta Yi'$ (i=1, ..., n)) of the electron beam irradiation position on the wafer in the case where drawing is made by the electron beam having the area Si are corresponded.

In the case where there is the same area Si as the average value of the calculated electron beam area in the conversion table 204a, the change amount corresponding to the area Si is selected as the predicted value. On the other hand, in the case where there is no the same area Si as the average value of the calculated electron beam area in the conversion table 204a, for example, a value calculated by interpolation is selected as the predicted value.

Next, on the basis of the change amount of the charged beam irradiation position on the wafer predicted in step S3', the irradiation position of the electron beam that is irradiated onto the wafer is controlled such that the electron beam is radiated onto a predetermined position on the wafer (step S4').

Depending upon the area of the electron beam that is irradiated onto the second shaping aperture mask, there occurs a thermal fluctuation in the second shaping aperture mask 108. Along such a thermal fluctuation, the electron beam irradiation position on the wafer changes.

However, according to the present embodiment, the position of the electron beam is corrected such that the change amount of the electron beam irradiation position on the wafer becomes small (step S4'), and accordingly, it is possible to increase the positional precision of the electron beam irradiation onto the wafer.

Next, drawing is performed using the electron beam whose dimensions are corrected (step S5').

Thereafter, the steps S1 to S5' are repeated, and remaining patterns are drawn.

Thus, according to the present embodiment, the irradiation position error arising from the thermal expansion (temperature fluctuation) of the second shaping aperture mask 108 caused when the energy of the electron beam 102 is irradiated onto the second shaping aperture mask 108 is predicted, and the electron beam is corrected such that the predicted irradiation position error becomes small, thereby a charged beam exposure apparatus and a charged beam exposure method with high drawing precision is realized.

Fourth Embodiment

Figure 12:
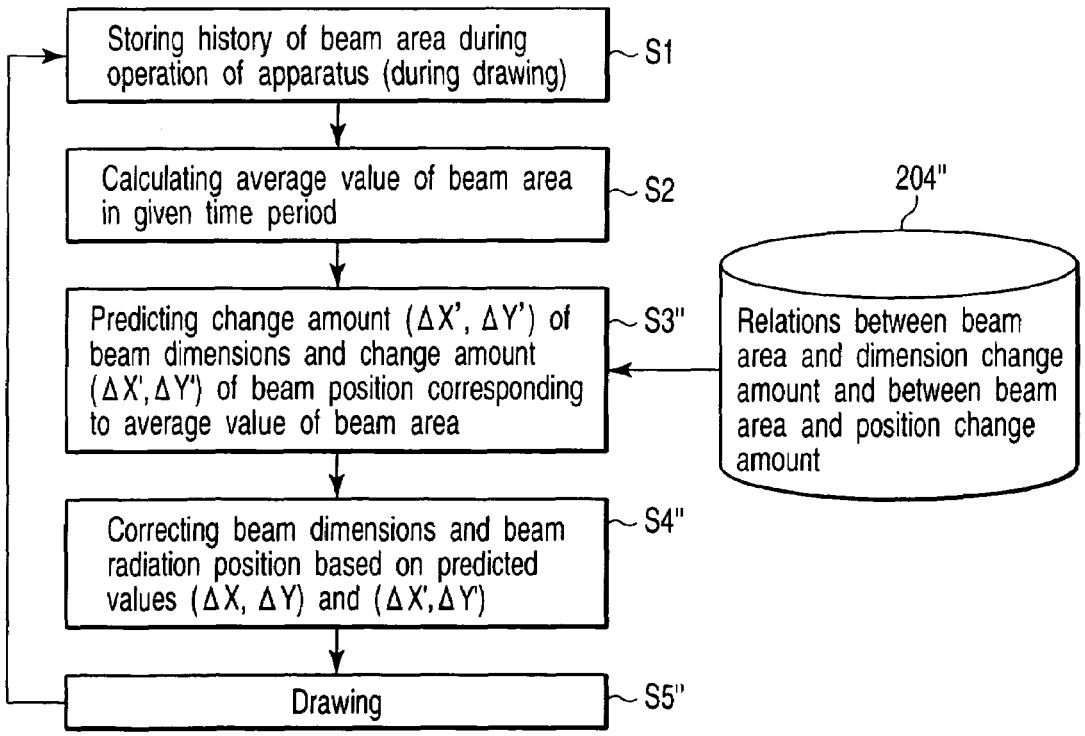
FIG. 12 is a flow chart showing a third drawing method according to a fourth embodiment.

FIG. 12 is a flow chart showing the third drawing method according to the present embodiment. The third drawing method is a method obtained by combining the first drawing method and the second drawing method. The third drawing method of the present embodiment may be carried out by an electron beam drawing apparatus comprising the correcting mechanism 200 of the first embodiment and the correcting mechanism 200b of the third embodiment, or an electron beam drawing apparatus comprising the correcting mechanism 200a of the second embodiment and the correcting mechanism 200b of the third embodiment.

First, the electron beam drawing apparatus is activated to store a history of an area of the electron beam during drawing (step S1).

Next, on the basis of the history of the area of the electron beam stored in step S1, an average value of the area of the electron beam in a given period of time is calculated (step S2).

Next, on the basis of the conversion table obtained in advance, there are predicted the change amount of dimensions of the electron beam that has passed through the second shaping aperture to the average value of the area of the electron beam calculated in step S2 and the change amount of the electron beam irradiation position on the wafer (step S3").

The conversion table has a table in which the area of the electron beam and the change amount of the dimensions of the electron beam that passes through the second shaping aperture are corresponded (for example, the beam area-dimension correction amount conversion table 204), and a table in which the area of the electron beam and the change amount of the electron beam irradiation position on the wafer are corresponded (the beam area-position correction amount conversion table).

Next, on the basis of the change amount of the dimensions predicted in step S3", the dimensions of the electron beam that is irradiated onto the second shaping aperture mask and the irradiation position of the electron beam that is irradiated onto the wafer are corrected such that predetermined dimensions and a predetermined position are attained (step S4").

Next, drawing is performed using the electron beam whose dimensions are corrected (step S5").

Thereafter, the steps S1 to S5" are repeated, and remaining patterns are drawn.

Thus, according to the present embodiment, there are predicted the dimension error of the electron beam irradiated onto the second shaping aperture mask 108 arising from the thermal expansion (temperature fluctuation) of the second shaping aperture mask 108 caused when the energy of the electron beam 102 is irradiated onto the second shaping aperture mask 108, and the electron beam irradiation position error on the wafer, and the position of the electron beam 102 that is irradiated onto the second shaping aperture mask 108 and the irradiation position of the electron beam 102 that is irradiated onto the wafer are corrected such that the predicted dimension error and irradiation position error become small, thereby, a charged beam exposure apparatus and a charged beam exposure method with high drawing precision is realized.

Fifth Embodiment

Next, a mask manufacturing method of the present embodiment will be explained hereinafter.

First, a sample is prepared which comprises a transparent substrate, a light shielding film provided on the transparent substrate, and a resist applied on the light shielding film. The transparent substrate is, for example, a quartz substrate, and the light shielding film is, for example, a chrome (Cr) film.

Next, by use of one of the charged beam exposure apparatus of the first to fourth embodiments, the resist is exposed to the electron beam 102 that has been emitted from the electron gun 101 of the charged beam exposure apparatus, and has passed through the second shaping aperture.

At this time, the resist is exposed to the electron beam 102 while correcting the electron beam 102 such that at least one of dimensions and a position of a pattern (here a resist pattern) corresponding to the electron beam 102 that has passed through the second shaping aperture and is to be formed on the sample 112, become a predetermined value (design dimensions).

Next, the exposed resist is developed to form a resist pattern.

Next, using the resist pattern as a mask, the light shielding film is etched to form a mask pattern made of the light shielding film. Thereafter, through well known processes such as a process of removing the resist pattern and the like, a photo mask is completed.

According to the present embodiment, the electron beam 102 is irradiated onto the resist such that at least one of the dimensions and the position of the resist pattern become the predetermined value, thereby a photo mask comprising a pattern in which at least one of the mask pattern dimension error and the mask pattern position error is sufficiently small is obtained.

Sixth Embodiment

Next, a method of manufacturing a semiconductor device of the present embodiment will be explained hereinafter.

First, a sample is prepared which comprises a substrate including a semiconductor substrate, and a photo resist provided on the substrate. The semiconductor substrate is, for example, a Si substrate or an SOI substrate. The substrate may comprise further a semiconductor elemental device formed on the semiconductor substrate. Or, the substrate may comprise further a semiconductor elemental device formed on the semiconductor substrate, and a wiring layer formed on the semiconductor elemental device.

Next, light is irradiated onto the photo mask manufactured by the mask method manufacturing of the fifth embodiment, the light that has passed through the photo mask is irradiated onto the photo resist, and the photo resist is exposed to the light.

Next, the exposed photo resist is developed to form a photo resist pattern.

Next, using the resist pattern as a mask, the substrate is etched to form a desired pattern. The desired pattern may be, for example, an isolation trench (STI) pattern, a contact hole pattern, a via hole pattern, a wiring trench pattern, or a wiring pattern.

In the case of the isolation trench pattern, the semiconductor substrate is etched. In the case of the contact hole pattern, the via hole pattern and the wiring slot pattern, an insulation film on the semiconductor substrate is etched. In the case of the wiring pattern, a metal film, a metal silicide film or a low resistant semiconductor film including impurities on the semiconductor substrate is etched.

Next, the resist pattern is removed.

Thereafter, the above processes are repeated a necessary number of times, and further through well known processes such as packaging and the like, a semiconductor device is completed.

According to the present embodiment, a photo mask in which at least one of the mask pattern dimension error and the mask pattern position error is small is used, thereby, a semiconductor device comprising a device pattern in which at least one of the device pattern dimension error and the device pattern position error is small is realized.

The present invention is not limited to the embodiments described above.

For example, in the embodiments, explanation has been made to the case of the electron beam drawing apparatus of a variably shaped beam type. However, the present invention may be applied also to a character projection type exposure apparatus and an EPL type exposure apparatus. Further, the present invention may be applied also to an exposure apparatus and an exposure method using other charged beams than the electron beam, for example, an ion beam.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged beam exposure apparatus comprising:
    a charged beam radiating unit configured to radiate a charged beam;
    a shaping unit including an opening for shaping the charged beam;
    a storage unit configured to store a history of data concerning a beam area of the charged beam on the shaping unit;
    a deflecting unit configured to irradiate the charged beam onto a desired position on a sample by deflecting the charged beam which has passed through the opening of the shaping unit;
    a calculating unit configured to calculate an average value of the beam area of the charged beam on the shaping unit in a given period of time based on the history of the data concerning the beam area of the charged beam stored in the storage unit;
    a predicting unit configured to predict at least one of change amount of dimensions of the charged beam passing through the opening to design dimensions of the opening and change amount of an irradiation position of the charged beam on the sample which are corresponding to the average value calculated by the calculating unit, the predicting the at least one of change amounts being carried out based on at least one of a relation between the beam area of the charged beam on the shaping unit previously prepared and change amount of the dimensions of the charged beam passing through the opening to the design dimensions of the opening for shaping the charged beam, and a relation between the beam area of the charged beam on the shaping unit previously prepared and change amount of the irradiation position of the charged beam on the sample; and
    a correcting unit configured to correct at least one of dimensions of a pattern which corresponds to the charged beam and is to be formed on the sample, a beam irradiation time and a beam irradiation position based on the change amount predicted by the predicting unit.

2. The charged beam exposure apparatus according to claim 1,
    wherein the pattern which corresponds to the charged beam and to be formed on the sample is a resist pattern.

3. The charged beam exposure apparatus according to claim 1,
    wherein the charged beam is an electron beam or an ion beam.

4. A method of manufacturing a mask comprising:
    preparing a sample comprising a transparent substrate, a light shielding film provided on the transparent substrate, and a resist applied on the light shielding film;
    exposing the resist to a charged beam while correcting the charged beam using a charged beam exposure apparatus of claim 1 such that at least one of dimensions and a position of a resist pattern which corresponds to the charged beam and is to be formed on the sample become a predetermined value;
    forming the resist pattern by developing the resist; and
    etching the light shielding film using the resist pattern as a mask.

5. A method of manufacturing a semiconductor device comprising:
    preparing a sample comprising a substrate including a semiconductor substrate, and a resist provided on the substrate;
    exposing the resist to light including irradiating light onto a mask, the mask being manufactured by a mask manufacturing method of claim 4, and irradiating the light which has passed through the mask onto the resist; and
    forming a resist pattern by developing the resist.

6. The method of manufacturing a semiconductor device according to claim 5,
    further comprising etching the substrate using the resist pattern as a mask.

7. A charged beam exposure method using a charged beam exposure apparatus comprising a charged beam radiating unit configured to radiate a charged beam; a shaping unit including an opening for shaping the charged beam; and a deflecting unit configured to irradiate the charged beam onto a desired position on a sample by deflecting the charged beam which has passed through the opening of the shaping unit, the method comprising:
    storing a history of data concerning a beam area of the charged beam on the shaping unit;
    calculating an average value of the beam area of the charged beam on the shaping unit in a given period of time based on the stored history of the data concerning the beam area of the charged beam;
    predicting at least one of change amount of dimensions of the charged beam passing through the opening to design dimensions of the opening and change amount of an irradiation position of the charged beam on the sample which are corresponding to the average value calculated by the calculating, the predicting the at least one of change amounts being carried out based on at least one of a relation between the beam area of the charged beam on the shaping unit previously prepared and change amount of the dimensions of the charged beam passing through the opening to the design dimensions of the opening for shaping the charged beam, and a relation between the beam area of the charged beam on the shaping unit previously prepared and change amount of the irradiation position of the charged beam on the sample; and
    correcting the charged beam based on the predicted change amount.

8. The charged beam exposure method according to claim 7,
    wherein the correcting the charged beam includes controlling at least one of the dimensions of a pattern which corresponds to the charged beam and is to be formed on the sample and the irradiation position of the charged beam on the sample such that the at least one of the dimensions of the pattern and the position of the pattern become a predetermined value.

9. The charged beam exposure method according to claim 7,
    wherein the correcting the charged beam includes controlling the position of the charged beam irradiated on the shaping unit such that the dimensions of the pattern which corresponds to the charged beam and is to be formed on the sample become a predetermined value.

10. The charged beam exposure method according to claim 7,
wherein the correcting the charged beam includes controlling the irradiation time of the charged beam on the sample such that the dimensions of the pattern which corresponds to the charged beam and is to be formed on the sample become a predetermined value.

11. The charged beam exposure method according to claim 7,
wherein the correcting the charged beam includes controlling the deflection amount of the charged beam by the deflecting unit such that the dimensions of the pattern which corresponds to the charged beam and is to be formed on the sample become a predetermined value.

12. The charged beam exposure method according to claim 7,
wherein the pattern which corresponds to the charged beam and is to be formed on the sample is a resist pattern.

13. The charged beam exposure method according to claim 7,
wherein the charged beam is an electron beam or an ion beam.

14. A method of manufacturing a semiconductor device using a charged beam exposure apparatus, the charged beam exposure apparatus comprising a charged beam radiating unit configured to radiate a charged beam; a shaping unit including an opening for shaping the charged beam; a deflecting unit configured to irradiate the charged beam onto a desired position on a sample by deflecting the charged beam which has passed through the opening of the shaping unit; the method of manufacturing the semiconductor device comprising:
storing a history of data concerning a beam area of the charged beam on the shaping unit;
calculating an average value of the beam area of the charged beam on the shaping unit in a given period of time based on the stored history of the data concerning the beam area of the charged beam;
predicting at least one of change amount of dimensions of the charged beam passing through the opening to design dimensions of the opening and change amount of an irradiation position of the charged beam on the sample which are corresponding to the average value calculated by the calculating, the predicting the at least one of change amounts being carried out based on at least one of a relation between the beam area of the charged beam on the shaping unit previously prepared and change amount of the dimensions of the charged beam passing through the opening to the design dimensions of the opening for shaping the charged beam, and a relation between the beam area of the charged beam on the shaping unit previously prepared and change amount of the irradiation position of the charged beam on the sample; and
correcting the charged beam based on the predicted change amount.

15. The method of manufacturing the semiconductor device according to claim 14,
wherein the correcting the charged beam includes controlling at least one of the dimensions of a pattern which corresponds to the charged beam and is to be formed on the sample and the irradiation position of the charged beam on the sample such that the at least one of the dimensions of the pattern and the position of the pattern become a predetermined value.

16. The method of manufacturing the semiconductor device according to claim 14,
wherein the correcting the charged beam includes controlling the position of the charged beam irradiated on the shaping unit such that the dimensions of the pattern which corresponds to the charged beam and is to be formed on the sample become a predetermined value.

17. The method of manufacturing the semiconductor device according to claim 14,
wherein the correcting the charged beam includes controlling the irradiation time of the charged beam on the sample such that the dimensions of the pattern which corresponds to the charged beam and is to be formed on the sample become a predetermined value.

18. The method of manufacturing the semiconductor device according to claim 14,
wherein the correcting the charged beam includes controlling the deflection amount of the charged beam by the deflecting unit such that the dimensions of the pattern which corresponds to the charged beam and is to be formed on the sample become a predetermined value.

* * * * *